United States Patent
Bolton

(10) Patent No.: US 7,806,059 B2
(45) Date of Patent: Oct. 5, 2010

(54) SLIDING TRAY

(76) Inventor: Alison Bolton, 4160 Suisun Valley Rd., Suite #E431, Fairfield, CA (US) 94534

( * ) Notice: Subject to any disclaimer, the term of this patent is extended or adjusted under 35 U.S.C. 154(b) by 304 days.

(21) Appl. No.: 11/843,630

(22) Filed: Aug. 22, 2007

(65) Prior Publication Data

US 2008/0047869 A1   Feb. 28, 2008

Related U.S. Application Data

(60) Provisional application No. 60/823,130, filed on Aug. 22, 2006.

(51) Int. Cl.
*A47B 23/00* (2006.01)
(52) U.S. Cl. .................. 108/43; 108/50.01; 248/918
(58) Field of Classification Search .............. 108/43, 108/50.11, 161; 248/444, 441.1, 918
See application file for complete search history.

(56) References Cited

U.S. PATENT DOCUMENTS

| | | | |
|---|---|---|---|
| 2,770,514 A * | 11/1956 | Idso .................. 108/43 |
| 3,677,790 A * | 7/1972 | Bishop ................ 428/341 |
| 5,386,964 A * | 2/1995 | Mayo ............... 248/346.01 |
| 5,692,815 A * | 12/1997 | Murphy .................. 108/43 |
| 5,732,849 A * | 3/1998 | Brooks ................. 220/603 |
| 6,050,200 A * | 4/2000 | Sullins et al. ............ 108/43 |
| 6,115,249 A * | 9/2000 | Cipolla et al. .......... 248/923 |
| 6,131,862 A * | 10/2000 | Gruenenfelder ........ 248/918 |
| 6,173,656 B1 * | 1/2001 | Blanchard .............. 108/43 |
| 6,682,040 B1 * | 1/2004 | MacEachern ......... 248/918 |
| 6,986,308 B1 * | 1/2006 | King et al. ............. 108/43 |
| 7,161,799 B2 * | 1/2007 | Lim et al. ........... 361/679.55 |
| 7,249,747 B2 * | 7/2007 | Marceau et al. ........ 108/43 |
| 7,275,724 B1 * | 10/2007 | Ward ................... 108/43 |
| 7,522,411 B2 * | 4/2009 | Haglund ............. 248/346.3 |
| 7,536,960 B1 * | 5/2009 | Perez et al. ............. 108/43 |
| 2003/0230220 A1 * | 12/2003 | Evans et al. ............ 108/43 |
| 2005/0211138 A1 * | 9/2005 | Gupta ................... 108/43 |

* cited by examiner

*Primary Examiner*—José V Chen

(57) ABSTRACT

A substantially planar body, which can be coupled with elongated members on opposite ends of the planar body forming handles. The planar body has a first side and a second side, where the first side can have an anti-static layer or protrusions, and a layer made of a material to disperse the heat from an object placed on it, and the second side can be made of a material with a low coefficient of friction to allow the body to move across a surface with minimal resistance.

5 Claims, 4 Drawing Sheets

SLIDING TRAY

STATEMENT OF PRIORITY

The following application claims priority to U.S. Provisional Patent Application No. 60/823,130, filed Aug. 22, 2006, the complete contents of which are hereby incorporated by reference.

BACKGROUND

1. Field of the Invention

The present device relates to the field of sliding trays, particularly those for use with computer servers or other heavy items.

2. Background

Many homes and offices contain pieces of equipment and furniture that can be heavy, bulky, and difficult to move. In particular, computer servers are an essential piece of equipment in most offices and homes. Although they often remain stationary, it can be desirable to move them around occasionally for cleaning or maintenance. However, servers can often be heavy and bulky, making them difficult to move. Attempts to move servers, or other unwieldy pieces of equipment, can cause injury, especially when a person attempts to do so in an unsound ergonomic position.

Placing a server or other piece of furniture or equipment on a wheeled cart can aid in moving a server to a new location. However, wheels can get stuck or break down, rendering such a cart useless. Further, placing a server or other item on a wheeled platform can place the server or other item in an unstable position. A server or other item could be damaged if a wheeled cart holding it broke loose and ran into another piece of furniture, a wall, or tipped over.

In addition, servers usually heat up during operation. However, overheating can cause serious damage to the electronics and potentially destroy a server. Therefore, it can be desirable to place a server on a surface that can help to dissipate heat before it reaches a dangerous level. Unfortunately, most computer users place servers directly onto the floor, which can lead to dangerous heat build-up.

Electrical surges can also harm computer servers by if too much power passes through the delicate electronics. Surge-protector power strips can help to minimize this threat. However, these devices only protect a server from the point at which it is plugged into the power strip. A surge of static electricity from another source could still pass through the server and damage it.

What is needed is a device to hold a computer server or other item that facilitates moving the server or other item, while also protecting a computer server from overheating and power surges.

DETAILED DESCRIPTION

Figure 1:
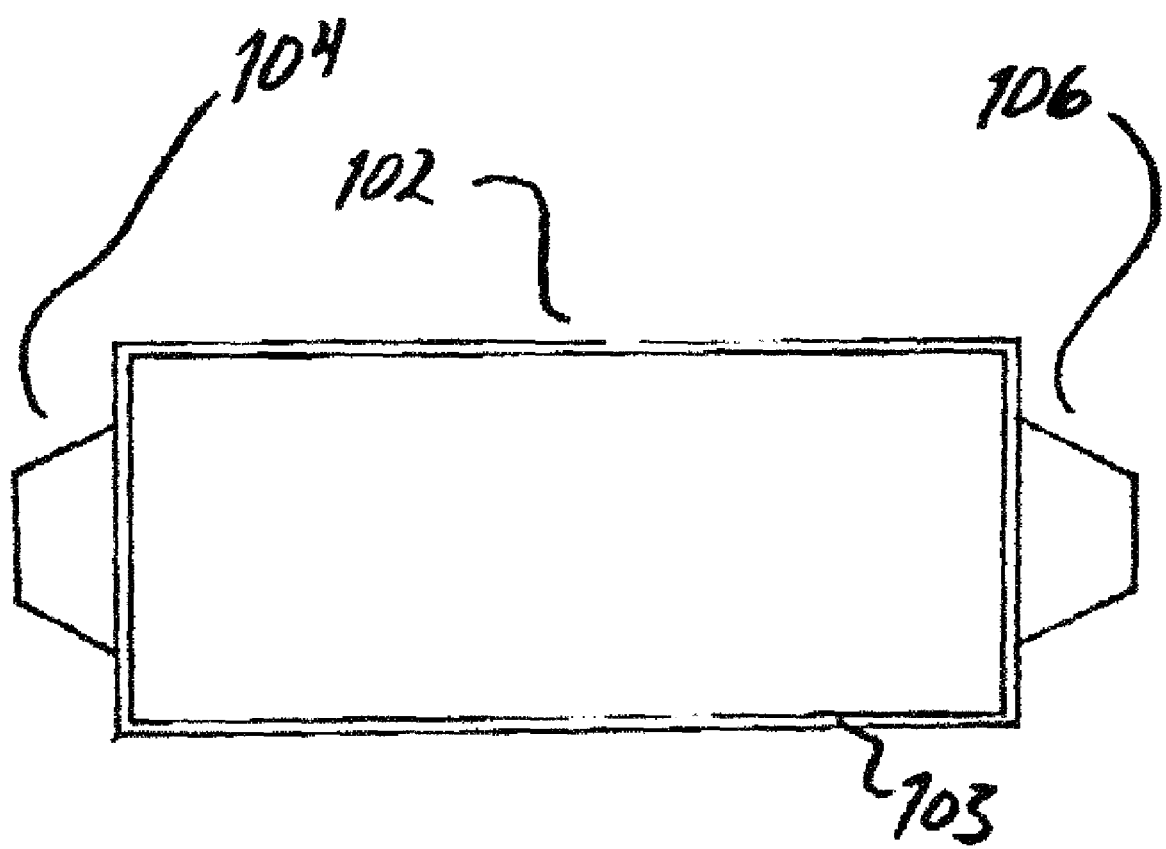
FIG. 1 depicts a planar view an embodiment of the present device.

FIG. 1 depicts a top planar view of an embodiment of the present device. In the embodiment shown, the device can comprise a substantially planar body 102 that can be configured to have a substantially rectangular exterior border 103. A substantially planar body 102 can be coupled with a first elongated member 104 at one end of a substantially planar body 102, which can form a handle. In some embodiments, a second elongated member 106 can be coupled to the opposite end of a substantially planar body 102, which can form a pair of handles. Although shown here in a rectangular configuration, the planar body can be cut to any desired or convenient shape.

Figure 2:
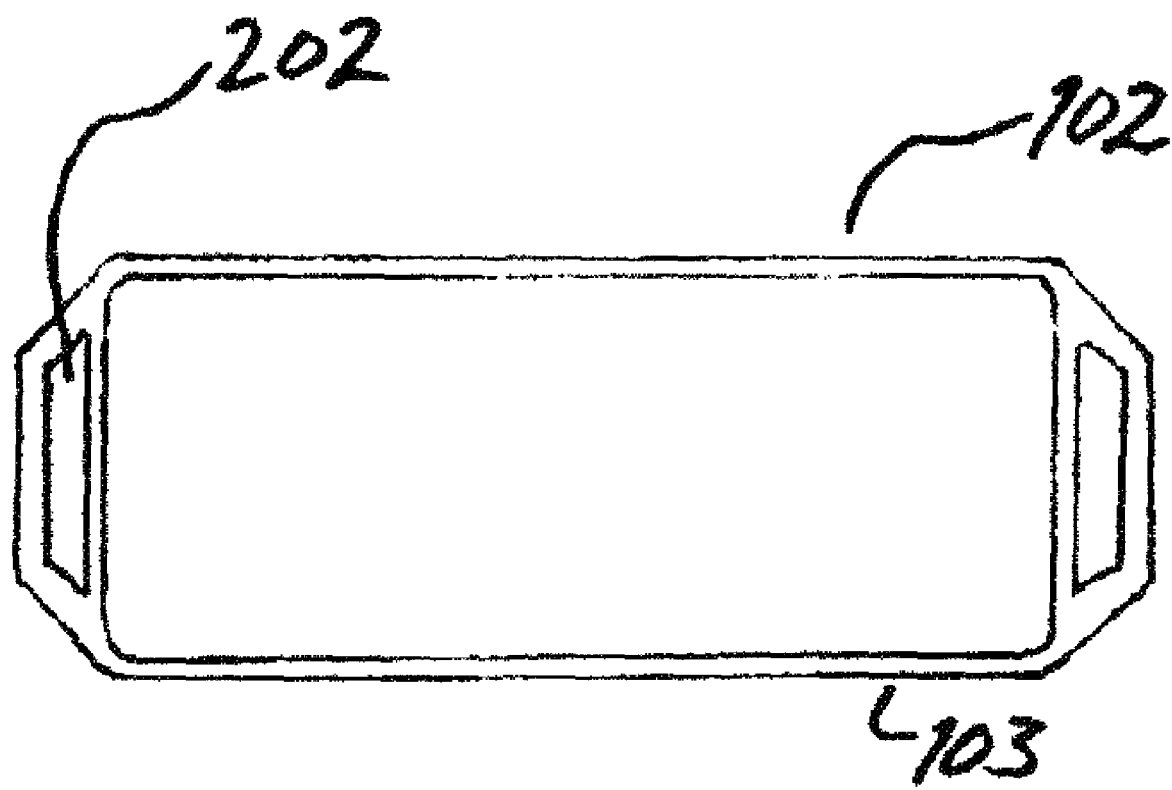
FIG. 2 depicts an alternative embodiment of the device.

FIG. 2 depicts an alternative embodiment of the device in which a substantially planar body 102 can have openings 202 large enough to accommodate human fingers, cut through the substantially planar body 102, substantially proximal to opposite ends of the substantially planar body 102 outside of a substantially rectangular exterior border 103. In some embodiments, openings 102 can be trapezoidal, but in other embodiments can be ovoid, rectangular, or any other known and/or convenient geometry.

In alternative embodiments, handles can be formed by affixing any elongated member directly to the ends or sides of a substantially planar body 102.

Figure 3:
FIG. 3 depicts a cross-sectional view of an embodiment of the present device.

FIG. 3 depicts a side cross-sectional view of an embodiment of the present device. In the embodiment shown, a substantially planar body 102 can be formed of at least one layer of material that can both disperse heat and have a low coefficient of friction, which can allow the planar body to move across a surface with minimal resistance and also disperse the heat of an object placed on it.

Figure 4:
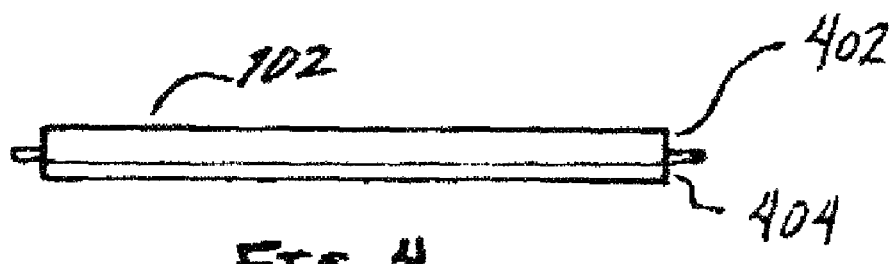
FIG. 4 depicts an alternative embodiment of the device depicted in FIG. 3.
Figure 5:
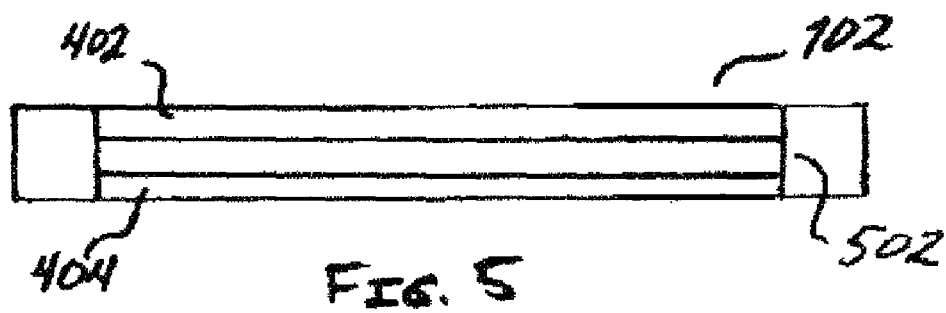
FIG. 5 depicts an alternative embodiment of the device depicted in FIG. 3.

FIGS. 4 and 5 depict side cross-sectional views of alternative embodiments of the device depicted in FIG. 3, wherein a substantially planar body 102 can be comprised of a plurality of layers. A first layer 402 on a substantially planar body's 102 first side can comprise a heat-dispersing material, such as, but not limited to copper, allowing for the dispersal of heat from an object placed on it. An second layer 404 on the planar body's second side can comprise a material with a low coefficient of friction, such as, but not limited to silk, allowing a substantially planar body 102 to move across a surface with minimal resistance. If the planar body is formed from more than two layers as shown in FIG. 5, at least one intermediate layer 502 between a first layer 402 on the substantially planar body's 102 first side and a second layer 404 on a substantially planar body's 102 second side can comprise any known and/or convenient material.

Figure 6:
FIG. 6 depicts an alternative embodiment of the device depicted in FIG. 3.

FIG. 6 depicts a cross-sectional view of an alternate embodiment of the device shown in FIG. 1. In the embodiment shown in FIG. 6, the device can include an anti-static layer 602, which in some embodiments can be a synthetic rubber such as neoprene, seated within an exterior low-frictional-coefficient surface, which in some embodiments can be comprised, at least in part, of polycarbonate. In embodiments shown in FIG. 6, the top surface of the interior anti-static layer can be configured to be flush with the rounded side surfaces of the exterior surface. However, in alternative embodiments, the interior layer and the exterior surface can be configured to meet in any know and/or convenient manner.

Figure 7:
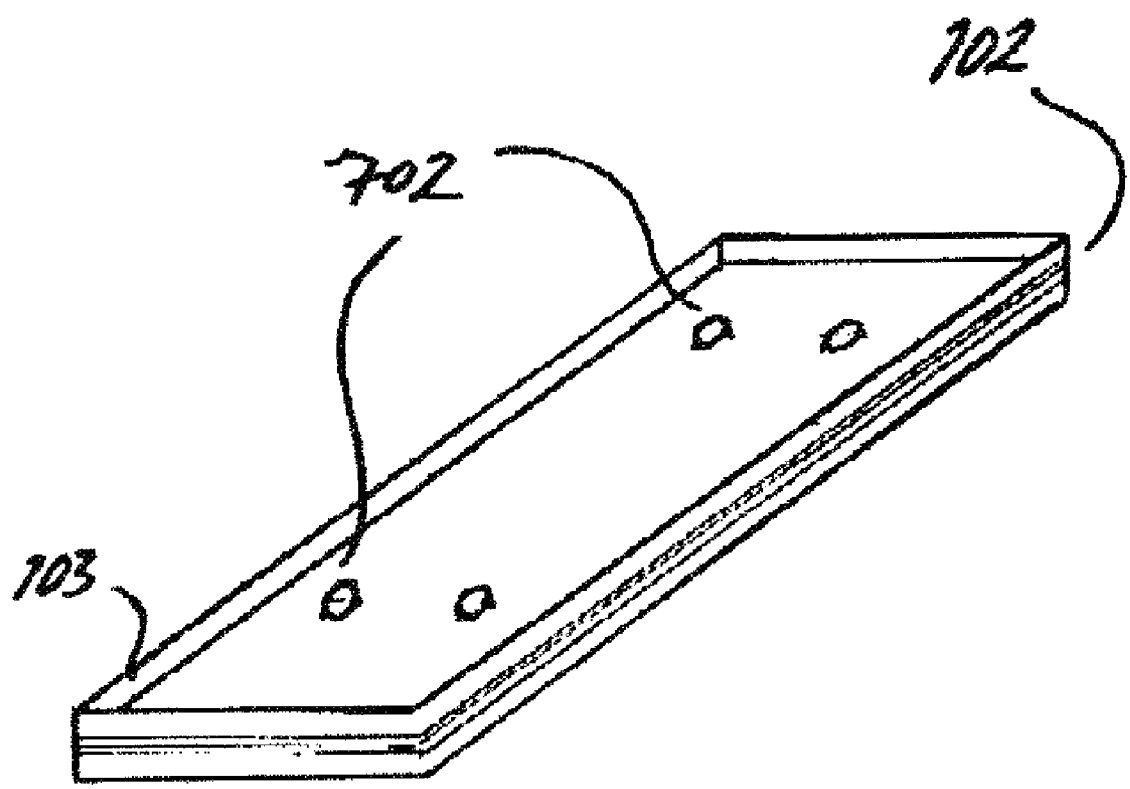
FIG. 7 depicts a perspective view of an alternative embodiment of the present device.

In other embodiments, as shown in FIG. 7, a plurality of protrusions 702 can extend out from a substantially planar body's 102 first side. A plurality of protrusions 702 can comprise copper or any other known and/or convenient anti-static material.

In use, a heavy or bulky item, such as a computer server can be placed to rest on a substantially planar body's 102 first side. A substantially rectangular border 103 can help to secure an item in position on the device. A first elongated member 104 and a second elongated member and a second elongated member 106 can assist with proper ergonomic hand placement. In some embodiments, an anti-static layer 602 can protect a computer server from harmful electrical discharge. In other embodiments, a plurality of protrusions 702 can either separately or in conjunction with an anti-static layer 602 can protect a computer server from harmful electrical discharge. A first layer 402 can allow for heat dispersion from the base of a computer server. If a user wishes to move a heavy or bulky item placed on the device, a second layer 404 can provide a reduced coefficient of friction between a server and the floor, thus facilitating sliding a server across a floor by lessening the weight resistance and potentially reducing the risk of injury to a user due to muscle strain.

Although the invention has been described in conjunction with specific embodiments thereof, it is evident that many alternatives, modifications and variations will be apparent to those skilled in the art. Accordingly, the invention as described and hereinafter claimed is intended to embrace all such alternatives, modifications and variations that fall within the spirit and broad scope of the appended claims.

What is claimed is:

1. An apparatus, comprising:
   a substantially planar body having a first surface and a second surface;
   at least one protrusion extending substantially orthogonally from said first surface, the at least one protrusion adapted to selectively engage and electrically couple an underside of a case of a desktop computer with the first surface;
   wherein the first surface further comprises a layer of anti-static material;
   and a layer of heat-dissipating material, only the protrusion consists of copper
   and wherein said second surface further comprises a layer of anti-friction material adapted to slideably rest upon a substantially planar support surface.

2. The apparatus of claim 1, further comprising at least one elongated member affixed to at least one end of said substantially planar body.

3. The apparatus of claim 1, further comprising a substantially rectangular border raised from the first surface of said substantially planar body.

4. The apparatus of claim 1, wherein said at least one protrusion is made of copper.

5. The apparatus of claim 1, wherein said substantially planar body has a rectangular shape.

* * * * *